United States Patent [19]

Davis et al.

[11] 4,096,399
[45] Jun. 20, 1978

[54] CROSSPOINT BIAS CIRCUIT ARRANGEMENT

[75] Inventors: James Alvin Davis, Glen Ellyn; William Jay Ooms, Schaumburg, both of Ill.

[73] Assignee: Bell Telephone Laboratories, Incorporated, Murray Hill, N.J.

[21] Appl. No.: 781,789

[22] Filed: Mar. 28, 1977

[51] Int. Cl.$^2$ .......................................... H03K 17/00
[52] U.S. Cl. .................... 307/249; 307/253; 307/297; 307/299 B; 179/18 GF
[58] Field of Search ............ 307/249, 299 B, 296, 307/297, 254, 253; 357/34; 179/18 GF; 340/166 R

[56] References Cited

U.S. PATENT DOCUMENTS

| | | | |
|---|---|---|---|
| 3,207,927 | 9/1965 | Wells | 307/254 |
| 3,387,222 | 6/1968 | Hellwarth et al. | 307/249 |
| 3,531,658 | 9/1970 | Chong | 307/242 |
| 3,883,696 | 5/1975 | Richards | 179/18 GF |

*Primary Examiner*—Stanley D. Miller, Jr.
*Assistant Examiner*—B. P. Davis
*Attorney, Agent, or Firm*—John C. Albrecht

[57] ABSTRACT

A semiconductor transmission circuit arrangement which utilizes symmetrical transmission transistors and bias circuitry which exhibits a high output impedance and is arranged to maintain equal d.c. bias currents in the base and the emitter/collectors of the transmission transistor. A multiple collector transistor is utilized as a primary current source and a current mirror circuit is used as a control arrangement.

8 Claims, 3 Drawing Figures

CROSSPOINT BIAS CIRCUIT ARRANGEMENT

FIELD OF THE INVENTION

This invention relates to analog transmission switching circuit arrangements.

BACKGROUND OF THE INVENTION

In analog transmission switching circuits the insertion loss of the switch and the linearity of transmission through the switching circuit are of concern. Metallic switches such as reed relays, crossbar switches, etc., have been widely used since such switches have low insertion loss, high open circuit impedance, linear transmission characteristics, and are bilateral for a large range of signal amplitudes and frequencies. Additionally, in such metallic switches the control circuitry is physically and electrically isolated from the switched transmission path. Semiconductor switches consisting of two or more unsymmetrical transistors connected in a variety of series and parallel arrangements and PNPN switches have been used in the prior art, however, such replacement arrangements have undesirable transmission or control characteristics.

SUMMARY OF THE INVENTION

In accordance with the present invention, an analog switching circuit comprises a symmetrical transmission switching transistor and controllable high impedance current control circuits for selectively saturating the transmission switching transistor. The transmission switching transistors have identical transmission electrodes each termed emitter/collector electrodes herein and a base terminal. The current control circuits are connected to the base and emitter/collector terminals of the transmission switching transistor. It is convenient to place a current control circuit in only one emitter/collector terminal circuit; however, this invention may be practiced by placing current control circuits in both emitter/collector terminal circuits. The current control circuits serve to maintain equal current in the base and emitter/collector circuits.

Advantageously, crosspoints so controlled have a symmetrical, low loss transmission characteristic which is linear about the zero crossing for bipolar signals of reasonable current amplitude.

When constructed in integrated form, a totally symmetrical transistor when driven from a perfect current source (a current source having a high impedance such that the transmission switching transistor is retained in saturation for all transmitted a.c. signals) will provide two equal and opposite (and hence canceling) signals between the emitter/collector electrodes of the switching transistor and the substrate over which the transistor is constructed. In addition, careful matching of the currents through the current control circuits should eliminate undesired d.c. current flow in the external circuitry.

In accordance with one aspect with one aspect of this invention, current mirror circuits are utilized to maintain equal currents in the emitter/collector and base of the transmission transistor. Advantageously, transmission switching circuits constructed in accordance with this invention effectively separate the transmitted signals from the control circuitry, since the control circuitry presents a high impedance, and since control current flow in the external transmission circuit is virtually eliminated by the current mirror circuits.

DETAILED DESCRIPTION

Figure 1:
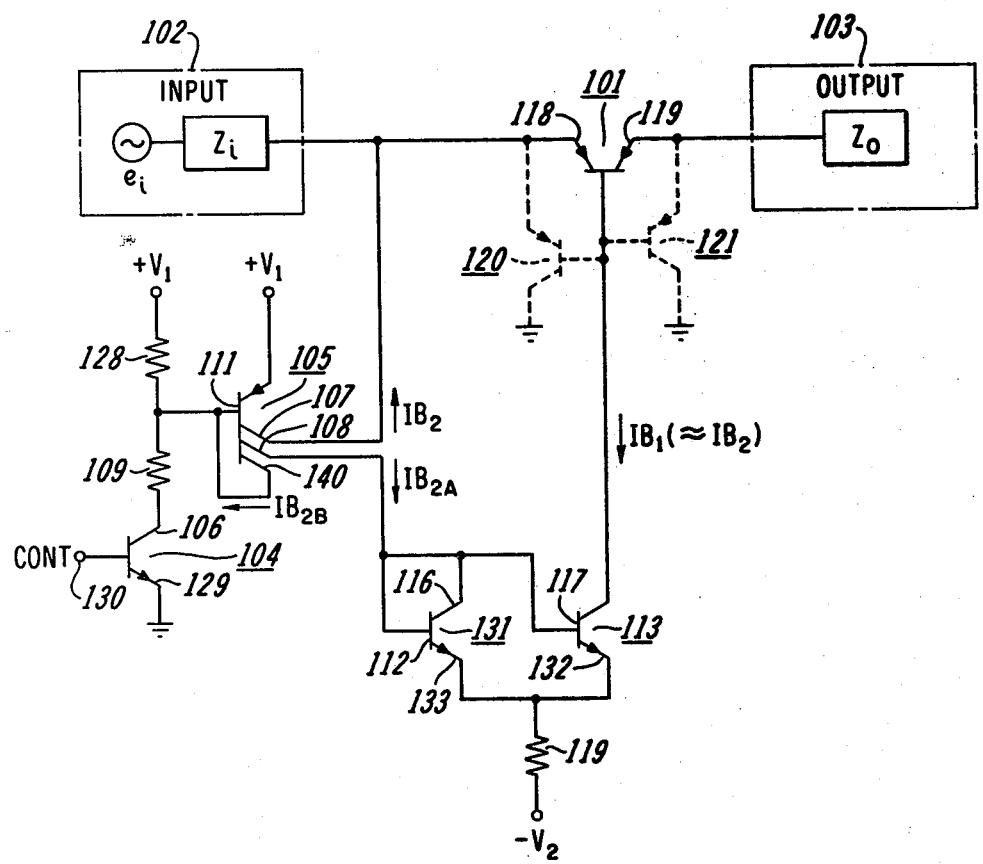
FIG. 1 is a schmatic representation of a switching circuit in accordance with the present information.

In FIG. 1 there is shown a bilateral bipolar transistor 101 which is utilized to selectively interconnect the input signal source 102 and the output circuit 103. Although transmission is shown only in the direction from the signal source 102 to the output circuit 103, it is to be understood that the transistor 101 is a bilateral switch which can serve to transmit bipolar signals on a bilateral basis. In accordance with this invention, the crosspoint bias circuitry which comprises the transistors 105, 131, and 113, is arranged to provide sufficient current to saturate transistor 101 (both junctions forward biased) and to assure that the d.c. current ($IB_2$) which flows into the emitter/collector equals the d.c. current ($IB_1$) flowing out of the base of the transistor 101. Additionally, the portions of the bias circuitry connected to the emitter/collector and base terminals of the transistor 101 comprise current control circuits which each exhibit high output impedance.

Since the currents in the base and emitter/collector circuits are matched, base bias current for the transistor 101 need not be returned or supplied through the external circuits 102 and 103. Since the output impedances of the bias circuits connected to the base and emitter terminals of the transistor 101 are high, they effectively decouple the transmission signal provided by the input circuit 102 from the control circuitry.

In FIG. 1 the transistor 105 comprises a single emitter and a plurality of collectors. The construction of the transistor 105 is such that the elcetrical performance is identical for the collectors 107, 108, and 140. The transistor 104 under control of signals on the control terminal 130 serves to control the transistor 105. A positive signal on terminal 130 serves to turn on the transistor 104 and place the collector 106 at approximately groung potential. Under these conditions the current through the resistor 109 will be supplied primarily from the collector 140 connected to the base 111 of transistor 105. Therefore, the current in collector 140 (labeled $IB_{2B}$) is determined by resistor 109 and the voltage $V_1$ minus the emitter base voltage of transistor 105 and minus the collector-emitter voltage of transistor 104. Accordingly, the transistor 105 will be turned on, and equal currents labeled $IB_2$ and $IB_{2A}$ (each equal to $IB_{2B}$) will flow through the circuits external to the collectors 107 and 108.

A current mirror circuit which comprises the diode connected transistor 131 and the transistor 113 serves to maintain equal bias currents in the base and emitter/collector circuits of the transistor 101. As seen in FIG. 1 the collector terminal 116 of the transistor 131 is connected to the base terminal 112, thus causing the transistor 131 to appear as a diode between the base 112 and the emitter 133. In that the base and emitter terminals 112, 117, and 133, 132 of the transistors 131 and 113 are respectively interconnected, the drop across the base-emitter junction 112-133 of the diode connected transistor 131 equals the drop across the junction 117-132 of transistor 113. Since the transistors 131 and 113 are designed to have identical operating characteristics, the above-described connections will cause substantially equal currents to flow through the diode connected transistor 131 and through the collector-emitter circuit of the transistor 113. Further, since the current flowing from the collector 107 to the emitter of the transistor 101 equals the current in the collector 108, the desired condition, wherein the current supplied to the base of the transistor 101 is equal to the current drawn from the emitter/collector of that transistor, is achieved.

It is assumed that signals to be transmitted from a source, e.g., 102, to a load, e.g., 103, are limited in amplitude so that the transmission switching transistor 101 will be held in saturation for all transmitted signals. Under these conditions the transistor 101 will present a relatively low impedance between the terminals 118 and 119 and the operating characteristic of the transistor 101 will remain linear about the zero crossing of the voltage-current characteristic.

Figure 2:
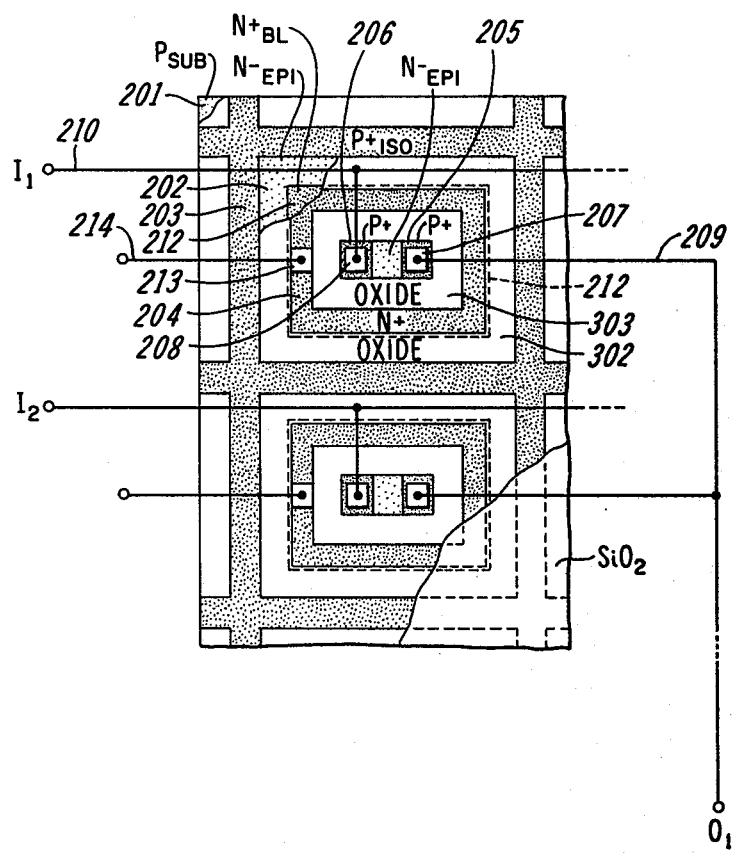
FIG. 2 is a top view of a pair of symmetrical transmission transistor crosspoints constructed in integrated form.
Figure 3:
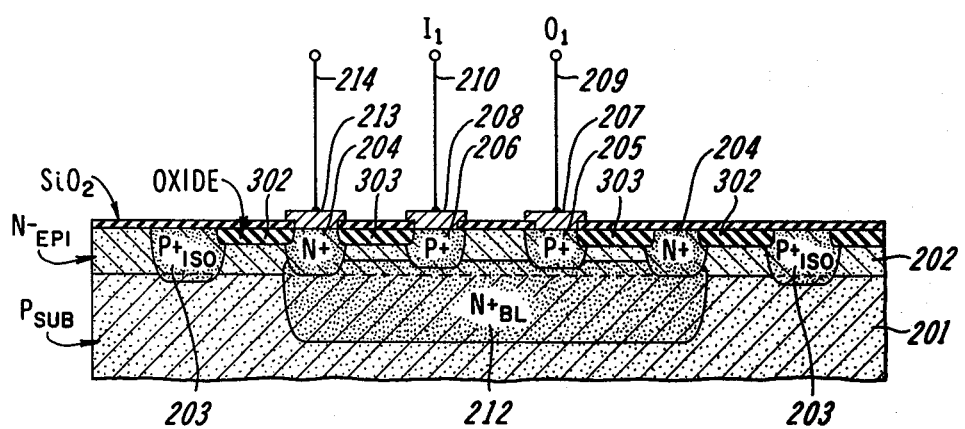
FIG. 3 is a cross section of a transistor crosspoint of FIG. 2.

The construction of a symmetrical transmission transistor such as 101, shown in FIGS. 2 and 3, is described in greater detail in the application identified as Fulton-Ooms-Reed Case 8-2-5 filed of even date herewith. When a transmission switching transistor is constructed in integrated form, e.g., as shown in FIGS. 2 and 3 and described below herein, there are, as shown in FIG. 1, two parasitic PNP transistors 120 and 121 which are respectively connected to the two emitter/collector terminals of the transistor 101. The parasitic transistors 120 and 121 each comprise and share the emitter and base regions with the transmission switching transistor 101 and the collector regions of these parasitic transistors comprise active portions of the substrate over which the integrated circuit is constructed. Accordingly, the collectors of the transistors 120 and 121 are connected to the same potential as the substrate. For the circuit connections described above herein, some d.c. bias current flows through these parasitic transistors, but for any loss of a.c. external signal through the transistor 120 to the substrate, and a.c. signal of equal amplitude and opposite polarity will flow through the transistor 121, if the transistor 101 is perfectly symmetrical. Accordingly, for all a.c. external signals applied to an emitter/collector terminal, e.g., 118, the net effect of the parasitic transistors 120, 121 will be zero.

Where the transmission switching transistor and the drive circuitry are constructed in descrete circuit form, all of the above-described advantages accrue to that circuitry. However, switching transmission transistors constructed in discrete form will not involve such parasitic transistors. Accordingly, the above description relative to the canceling effects of the parasitic transistors can be ignored.

In FIG. 2 there are shown two switching transmission transistors constructed in one illustrative integrated circuit form. A cross section of the upper transmission transistor of FIG. 2 is shown in FIG. 3. In FIGS. 2 and 3 the transmission transistors are formed in a body which comprises a p-type substrate 201 and an n-type epitaxial layer 202 overlying the substrate 201. Within the body there are a plurality of $n+$ buried tubs 212 over which the individual transmission switching transistors are formed. The transistors of FIGS. 2 and 3 comprise stripe shaped emitter/collector electrode regions 205, 206, which are of equal size, shape, and doping density. Access to these emitter/collector electrode regions is by way of the metallizations 207, 208 and the conductors 209 and 210. The portion 211 of the epitaxial layer interposed between the two emitter/collector electrode regions 205, 206 comprises the base of the transmission switching transistor. Access to that base is via the $n+$ buried tub 212, the $n+$ frame-shaped region 204 extending from the exposed surface of the epitaxial layer to the buried tub, the metallization 213, and the conductor 214. The individual switching transistor crosspoints are isolated by the deep $p+$ isolation regions 203. The optional deep oxide regions 302 and 303 serve to limit interaction between the $n+$ frame-shaped ring 204, the frame-shaped isolation region 203, and the two emitter/collector regions 205, 206.

As explained with regard to FIG. 1, a symmetrical transistor such as shown in FIGS. 2 and 3 constructed in integrated form includes two parasitic transistors 120, 121. Such parasitic transistors in FIGS. 2 and 3 comprise, for example, an emitter/collector electrode region 205, a portion of the $n+$ buried layer 212, and a portion of the substrate 201. A similar parasitic transistor exists with respect to the emitter/collector region 206. The bias circuitry of FIG. 1 is not shown in FIGS. 2 and 3, however, such circuitry may be on the same or another chip.

In FIG. 1 the bias circuitry is shown connected to the emitter/collector electrode region 118. It should be understood that this bias circuitry could be equally well applied solely to the emitter/collector electrode region 119, or alternatively bias circuitry can be connected to both emitter/collector electrodes 118 and 119 and the currents in those circuits adjusted to be equal to each other and their sum equal to the current $IB_1$ flowing in the base circuit.

In FIGS. 1, 2, and 3 the switching transmission transistor 101 is illustrated as a PNP structure and the types of transistors in the bias circuits are appropriately chosen. It is to be understood that NPN crosspoints can be used in the practice of this invention and, in that case, the transistors in the bias control circuits will be chosen to operate with NPN crosspoints.

What is claimed is:

1. A semiconductor transmission circuit arrangement comprising:
    a symmetrical transmission switching transistor comprising first and second emitter/collector transmission terminals and a base terminal; and
    a high impedance bias circuit arrangement connected to one of said emitter/collector transmission terminals and to said base terminal and comprising regulating means for selectively maintaining direct currents of equal amplitude in said base and in the circuit including said connected one pf said emitter/collector terminals.

2. A semiconductor transmission switching arrangement comprising:
    a symmetrical transmission switching transistor comprising first and second emitter/collector transmission terminals and a base terminal; and
    a high impedance bias circuit arrangement comprising independent means connected respectively to said first and said second emitter/collector transmission terminals and to said base terminal, and comprising regulating means for selectively maintaining the sum of direct currents in said emitter/collectors equal in amplitude to the current in said base.

3. A semiconductor transmission circuit arrangement comprising:

a symmetrical, bipolar, bilateral transmission transistor comprising first and second emitter/collector terminals and a base terminal;

a first controllable high impedance current source circuit connected to one of said emitter/collector terminals for selectively maintaining a first constant magnitude direct current signal in a circuit including said connected one of said emitter/collector terminals;

a second controllable high impedance current source circuit for selectively supplying a second constant magnitude direct current signal;

current regulating means comprising first and second terminals connected respectively to said base terminal and to said second current source circuit and comprising means for maintaining the base current of said transmission transistor equal in magnitude to said first constant current signal, said base current being of a magnitude sufficient to saturate said transmission transistor for a substantial range of a.c. signals supplied to said emitter/collector terminals; and means for generating signals for controlling said first and second current source circuits.

4. A semiconductor transmission circuit arrangement according to claim 3 wherein said second constant magnitude direct current signal is equal in magnitude to said first constant current signal.

5. A semiconductor transmission circuit arrangement according to claim 3 wherein said first and second controllable high impedance direct current source circuits each comprise a collector of a single multiple collector transistor.

6. A semiconductor transmission circuit arrangement comprising:

a PNP transmission comprising a base and first and second emitter/collector electrodes, said transistor constructed such that the electrical performances of said emitter/collector electrodes are identical;

a controllable PNP constant direct current source transistor having an emitter, a base, and a plurality of collectors, said current source transistor constructed such that said collectors have substantially identical electrical operating characteristics, one of said collectors connected to one of said emitter/collector electrodes;

means for generating signals for selectively controlling said current source transistor; and a current control circuit arrangement comprising first and second input terminals connected respectively to another of said collectors of said current source transistor and to said base of said transmission transistor, and means for controlling the current flowing from said base of said transmission transistor to be substantially equal in magnitude to the current flowing from said another collector.

7. A semiconductor transmission circuit arrangement in accordance with claim 6 wherein a further one of said collectors of said controllabe PNP current source transistor is directly connected to the base of said current source transistor.

8. A semiconductor transmission circuit arrangement in accordance with claim 6 wherein said current control circuit arrangement comprises a voltage input terminal, first and second NPN transistors constructed to have substantially identical electrical operating characteristics, the collector of said first transistor connected to the base thereof, the base of said second NPN transistor and to said first input terminal, the collector of said second transistor connected to said second input terminal and the emitters of said first and second transistors coupled to said third input terminal.

* * * * *

UNITED STATES PATENT AND TRADEMARK OFFICE
CERTIFICATE OF CORRECTION

PATENT NO. : 4,096,399
DATED : June 20, 1978
INVENTOR(S) : James A. Davis and William J. Ooms It is certified that error appears in the above-identified patent and that said Letters Patent are hereby corrected as shown below:

In the Detailed Description, column 2, line 34, "emitter" should read --emitter/collector--; column 2, line 40, "elcetrical" should read --electrical--; column 2, line 46, "groung" should read --ground--; column 3, line 48, "descrete" should read --discrete--. In claim 1, column 4, line 52, "pf" should read --of--. In claim 6, column 5, line 36, after "transmission" insert --transistor--.

Signed and Sealed this

Nineteenth Day of December 1978

[SEAL]

Attest:

RUTH C. MASON
Attesting Officer

DONALD W. BANNER
Commissioner of Patents and Trademarks